(12) United States Patent
Lin (10) Patent No.: US 8,466,000 B2
(45) Date of Patent: Jun. 18, 2013

(54) BACKSIDE-ILLUMINATED IMAGE SENSOR AND FABRICATING METHOD THEREOF

(75) Inventor: Yu-Tsung Lin, Dongshi Township, Taichung County (TW)

(73) Assignee: United Microelectronics Corp., Hsinchu (TW)

( * ) Notice: Subject to any disclaimer, the term of this patent is extended or adjusted under 35 U.S.C. 154(b) by 21 days.

(21) Appl. No.: 13/086,554

(22) Filed: Apr. 14, 2011

(65) Prior Publication Data

US 2012/0261780 A1    Oct. 18, 2012

(51) Int. Cl.
*H01L 31/18* (2006.01)

(52) U.S. Cl.
USPC ............ 438/70; 257/432; 257/E31.127

(58) Field of Classification Search
USPC .................. 257/432, E31.127; 438/70
See application file for complete search history.

(56) References Cited

U.S. PATENT DOCUMENTS

| | | | |
|---|---|---|---|
| 3,930,295 A | 1/1976 | Rose | |
| 4,148,048 A | 4/1979 | Takemoto | |
| 4,460,912 A | 7/1984 | Takeshita | |
| 4,533,624 A | 8/1985 | Sheppard | |
| 4,644,172 A | 2/1987 | Sandland | |
| 4,692,205 A | 9/1987 | Sachdev | |
| 4,745,451 A | 5/1988 | Webb | |
| 4,928,162 A | 5/1990 | Lesk | |
| 4,951,104 A | 8/1990 | Kato | |
| 5,070,380 A | 12/1991 | Erhardt | |
| 5,241,417 A | 8/1993 | Sekiguchi | |
| 5,246,803 A | 9/1993 | Hanrahan | |
| 5,294,288 A | 3/1994 | Melpolder | |
| 5,321,297 A | 6/1994 | Enomoto | |
| 5,466,926 A | 11/1995 | Sasano | |
| 5,587,696 A | 12/1996 | Su | |
| 5,604,073 A | 2/1997 | Krounbi | |
| 5,625,210 A | 4/1997 | Lee | |
| 5,650,864 A | 7/1997 | Tseng | |
| 5,830,624 A | 11/1998 | Bae | |
| 5,880,495 A | 3/1999 | Chen | |
| 5,977,535 A | 11/1999 | Rostoker | |
| 6,006,764 A | 12/1999 | Chu | |
| 6,071,826 A | 6/2000 | Cho | |
| 6,081,018 A | 6/2000 | Nakashiba | |
| 6,087,211 A | 7/2000 | Kalnitsky | |
| 6,124,200 A | 9/2000 | Wang | |
| 6,294,313 B1 | 9/2001 | Kobayashi | |

(Continued)

OTHER PUBLICATIONS

Hyuck in Kwon; In Man Kang; Byung-Gook Park; Jong Duk Lee; Sang Sik Park, "The analysis of dark signals in the CMOS APS imagers from the characterization of test structures", Feb. 2004, p. 178-184, vol. 51 Issue 2, Semicond. Res. Center & Sch. of Electr, Eng., Seoul Nat. Univ., South Korea.

*Primary Examiner* — Marc Armand
(74) *Attorney, Agent, or Firm* — Ding Yu Tan (57) ABSTRACT

A backside-illuminated image sensor and a fabricating method thereof are provided. The fabricating method includes the following steps. Firstly, a first substrate having a first side and a second side is provided, wherein a sensing structure is formed on the first side of the first substrate, and the sensing structure includes an alignment mark. Then, a second substrate is provided and bonded to the first side of the first substrate. Then, a light-transmissible structure is formed on the second side of the first substrate at a location corresponding to the alignment mark. Afterwards, an optical structure is positioned on the second side of the first substrate by referring to the light-transmissible structure and the alignment mark.

12 Claims, 7 Drawing Sheets

U.S. PATENT DOCUMENTS

| | | |
|---|---|---|
| 6,297,160 B1 | 10/2001 | Chien |
| 6,338,976 B1 | 1/2002 | Huang |
| 6,352,876 B1 | 3/2002 | Bordogna |
| 6,369,417 B1 | 4/2002 | Lee |
| 6,376,797 B1 | 4/2002 | Piwczyk |
| 6,388,278 B1 | 5/2002 | Suzuki |
| 6,407,415 B2 | 6/2002 | Lee |
| 6,433,844 B2 | 8/2002 | Li |
| 6,482,669 B1 | 11/2002 | Fan |
| 6,514,810 B1 | 2/2003 | Kim |
| 6,524,772 B1 | 2/2003 | Huang |
| 6,566,151 B2 | 5/2003 | Yeh |
| 6,570,145 B2 | 5/2003 | Huang |
| 6,617,189 B1 | 9/2003 | Lin |
| 6,632,700 B1 | 10/2003 | Fan |
| 6,641,464 B1 | 11/2003 | Steere, III |
| 6,664,191 B1 | 12/2003 | Kim |
| 6,673,689 B2 | 1/2004 | Al-Shareef |
| 6,730,555 B2 | 5/2004 | Kim |
| 6,794,215 B2 | 9/2004 | Park |
| 6,821,809 B2 | 11/2004 | Abe |
| 6,841,848 B2 | 1/2005 | MacNamara |
| 6,846,722 B2 | 1/2005 | Lee |
| 6,849,533 B2 | 2/2005 | Chang |
| 6,872,584 B2 | 3/2005 | Nakashiba |
| 6,921,934 B2 | 7/2005 | Patrick |
| 6,933,972 B2 | 8/2005 | Suzuki |
| 6,953,608 B2 | 10/2005 | Leu |
| 6,956,253 B2 | 10/2005 | Weng |
| 6,960,512 B2 | 11/2005 | Cheng |
| 7,006,294 B2 | 2/2006 | Steenblik |
| 7,078,779 B2 | 7/2006 | Wang |
| 7,094,512 B2 | 8/2006 | Otsuka |
| 7,115,924 B1 | 10/2006 | LaMaster |
| 7,129,108 B2 | 10/2006 | Jang |
| 7,129,172 B2 | 10/2006 | Morrow |
| 7,129,532 B2 | 10/2006 | Lee |
| 7,180,044 B2 | 2/2007 | Yu |
| 7,199,439 B2 | 4/2007 | Farnworth |
| 7,229,745 B2 | 6/2007 | Lamarre |
| 7,232,698 B2 | 6/2007 | Kim |
| 7,262,073 B2 | 8/2007 | Baek |
| 7,268,009 B2 | 9/2007 | Hwang |
| 7,315,359 B2 | 1/2008 | Hong |
| 7,328,915 B2 | 2/2008 | Smith |
| 7,498,190 B2 | 3/2009 | Kao |
| 7,648,851 B2 | 1/2010 | Fu |
| 2001/0023086 A1 | 9/2001 | Park |
| 2004/0122328 A1 | 6/2004 | Wang |
| 2005/0024520 A1 | 2/2005 | Yamamoto |
| 2005/0103983 A1* | 5/2005 | Yamaguchi et al. ....... 250/214.1 |
| 2005/0121599 A1 | 6/2005 | Mouli |
| 2005/0186739 A1 | 8/2005 | Wang |
| 2005/0247963 A1 | 11/2005 | Chen |
| 2005/0274988 A1 | 12/2005 | Hong |
| 2005/0274996 A1 | 12/2005 | Iwawaki |
| 2006/0054946 A1 | 3/2006 | Baek |
| 2006/0124833 A1 | 6/2006 | Toda |
| 2006/0146230 A1 | 7/2006 | Joon |
| 2006/0146412 A1 | 7/2006 | Kim |
| 2006/0172451 A1 | 8/2006 | Park |
| 2006/0183265 A1 | 8/2006 | Oh |
| 2006/0231898 A1 | 10/2006 | Jeong |
| 2007/0010042 A1 | 1/2007 | Li |
| 2007/0012970 A1 | 1/2007 | Mouli |
| 2007/0018073 A1 | 1/2007 | Hsu |
| 2007/0023851 A1 | 2/2007 | Hartzell |
| 2007/0031988 A1 | 2/2007 | Agranov |
| 2007/0052050 A1 | 3/2007 | Dierickx |
| 2007/0072326 A1 | 3/2007 | Zheng |
| 2007/0096173 A1 | 5/2007 | Kim |
| 2007/0096232 A1 | 5/2007 | Hwang |
| 2007/0117253 A1 | 5/2007 | Hsu |
| 2007/0158772 A1 | 7/2007 | Boettiger |
| 2007/0166649 A1 | 7/2007 | Yu |
| 2007/0202696 A1 | 8/2007 | Inuiya |
| 2008/0036020 A1 | 2/2008 | Ko |
| 2008/0055733 A1 | 3/2008 | Lim |
| 2008/0079103 A1 | 4/2008 | Liao |
| 2008/0121805 A1 | 5/2008 | Tweet |
| 2008/0121951 A1 | 5/2008 | Kao |
| 2008/0157144 A1 | 7/2008 | Lee |
| 2008/0169546 A1 | 7/2008 | Kwon |
| 2008/0265348 A1 | 10/2008 | Maas |
| 2009/0011534 A1* | 1/2009 | Yamamoto et al. ............ 438/69 |
| 2009/0066954 A1 | 3/2009 | Opsal |
| 2009/0121264 A1 | 5/2009 | Kao |
| 2009/0124037 A1 | 5/2009 | Yu |
| 2009/0127643 A1 | 5/2009 | Lu |
| 2009/0134484 A1 | 5/2009 | Lin |
| 2009/0168181 A1 | 7/2009 | Su |
| 2009/0200585 A1 | 8/2009 | Nozaki |
| 2009/0212335 A1 | 8/2009 | Kao |
| 2009/0256258 A1 | 10/2009 | Kreupl |
| 2009/0294888 A1 | 12/2009 | Tsai |
| 2009/0321862 A1 | 12/2009 | Yu |
| 2010/0003623 A1 | 1/2010 | Liu |
| 2010/0038688 A1 | 2/2010 | Wu |
| 2010/0044813 A1 | 2/2010 | Wu |
| 2010/0096359 A1 | 4/2010 | Shiu |
| 2010/0144156 A1 | 6/2010 | Shih |
| 2010/0159632 A1 | 6/2010 | Rhodes |
| 2010/0315734 A1 | 12/2010 | Wu |
| 2011/0057277 A1 | 3/2011 | Yu |

* cited by examiner

BACKSIDE-ILLUMINATED IMAGE SENSOR AND FABRICATING METHOD THEREOF

FIELD OF THE INVENTION

The present invention relates to an image sensor and a fabricating method thereof, and more particularly to a backside-illuminated image sensor and a fabricating method thereof.

BACKGROUND OF THE INVENTION

Figure 1A:
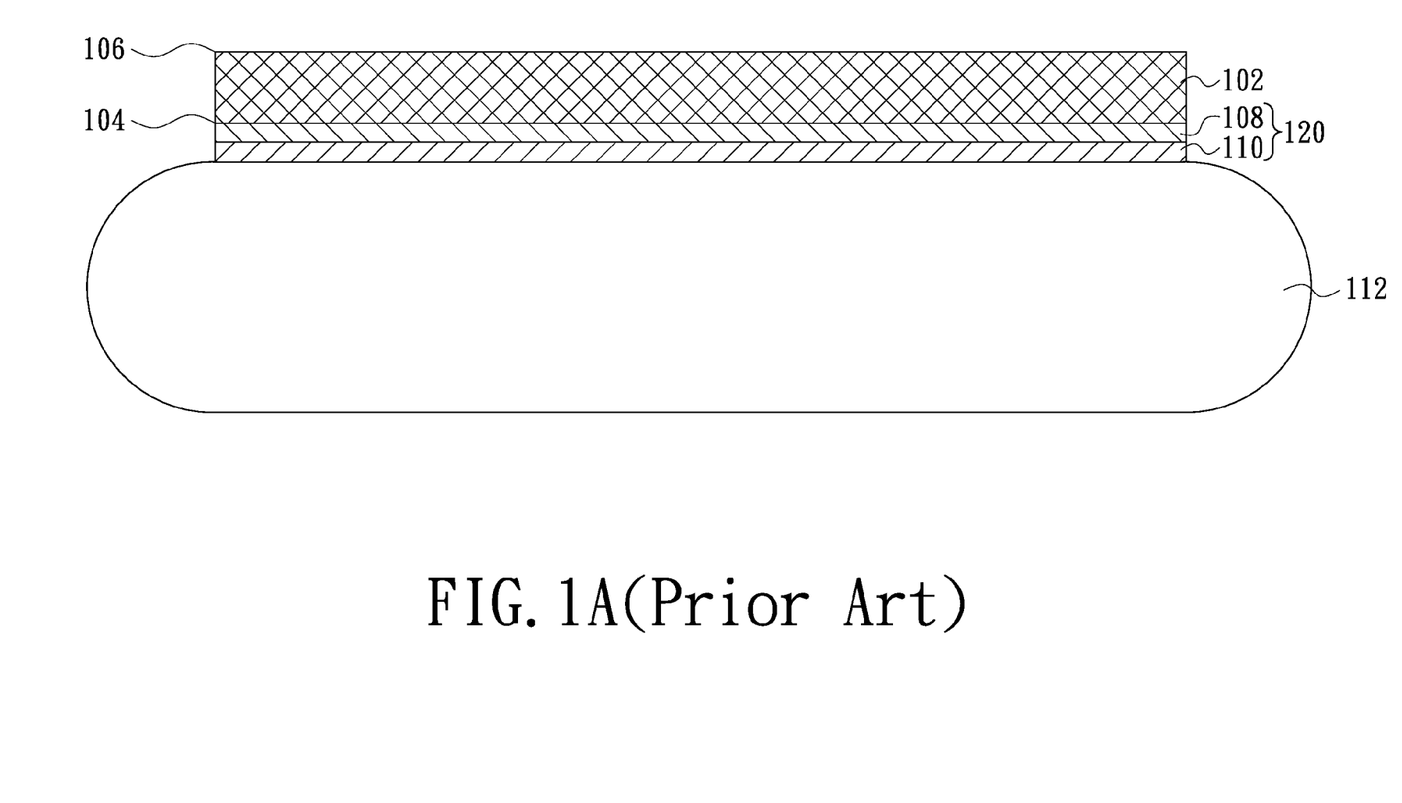
FIGS. 1A and 1B are schematic cross-sectional views illustrating partial steps of a method of fabricating a backside-illuminated image sensor according to prior art.
Figure 1B:
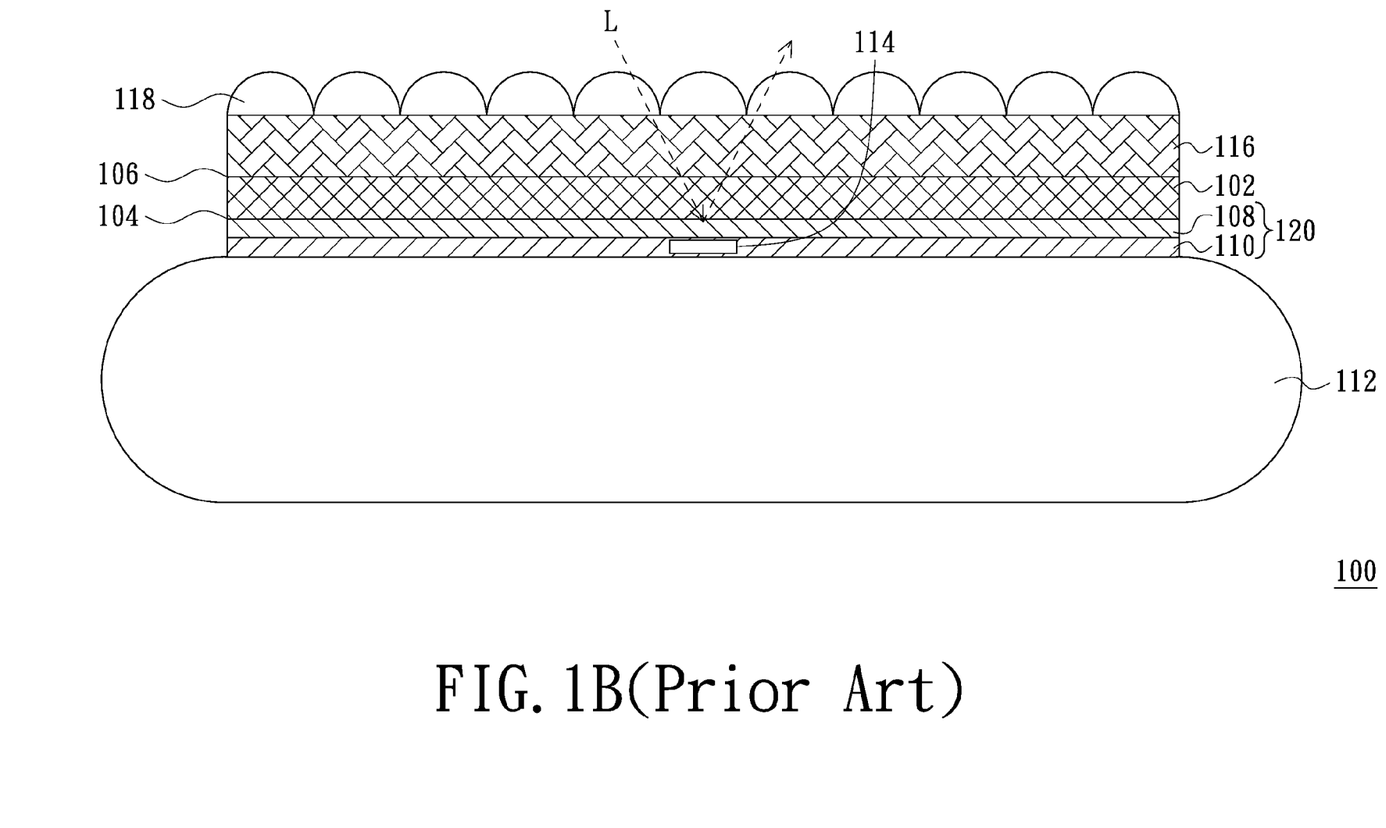

FIGS. 1A and 1B are schematic cross-sectional views illustrating partial steps of a method of fabricating a backside-illuminated image sensor according to prior art. Firstly, as shown in FIG. 1A, a first substrate 102 is provided. The first substrate 102 has a first side 104, which is defined as a front side where a sensing unit is to be disposed, and a second side 106, which is defined as a backside where an optical unit is to be disposed. Accordingly, a sensing structure 120 including a photodiode layer 108 and a metal wiring layer 110 is formed on the first side 104 of the first substrate 102. Subsequently, a second substrate 112 is bonded to the first substrate 102 at the first side 104 with the sensing structure 120.

As shown in FIG. 1B, for allowing the photodiode layer 108 of the sensing structure 120 to receive external light from the backside (i.e. the second side 106), the first substrate 102 is thinned from the second side 106. Then a color filter layer 116 and a microlens layer 118 are sequentially formed on the thinned first substrate 102 at the second side 106. While forming the color filter layer 116 and the microlens layer 118, a highly reflective pattern is formed in the wiring layer, serving as an alignment mark to align with a photo mask used in the process. If alignment is well done, positioning light L penetrates through the color filter layer 116 and the first substrate 102 will be reflected by the alignment mark 114 formed in the wiring layer 110 to the surroundings through the first substrate 102 and the color filter layer 116. Since the intensity of the positioning light L could be weakened to a level insufficient to make effective alignment after penetrating the color filter layer 116 and the first substrate 102 twice, it would be difficult to assure of the alignment of the color filter layer 116 and the microlens layer 118.

SUMMARY OF THE INVENTION

Therefore, the present invention provides a backside-illuminated image sensor for achieving effective alignment of a photo mask.

The present invention also provides a method of fabricating a backside-illuminated image sensor for achieving effective alignment of a photo mask.

In accordance with an aspect, the present invention provides a backside-illuminated image sensor. The backside-illuminated image sensor includes a first substrate, a second substrate and an optical structure. The first substrate has a first side and a second side. A sensing structure is formed on the first side of the first substrate. The sensing structure includes an alignment mark. A light-transmissible structure is formed on the second side of the first substrate at a location corresponding to the alignment mark. The second substrate is boned to the first side of the first substrate. The optical structure is positioned on the second side of the first substrate by referring to the light-transmissible structure and the alignment mark.

In an embodiment, the backside-illuminated image sensor further includes an adhesive layer, which is arranged between the sensing structure and the second substrate for bonding the second substrate with the first substrate.

In an embodiment, the sensing structure includes a photodiode layer and a metal wiring layer. The metal wiring layer is arranged between the photodiode layer and the second substrate.

In an embodiment, the light-transmissible structure is an opening, wherein the area of the opening is greater than or equal to the area of the alignment mark.

In an embodiment, the depth of the opening is equal to the thickness of the first substrate.

In an embodiment, the depth of the opening is smaller than the thickness of the first substrate.

In an embodiment, the light-transmissible structure includes an opening and a light-transmissible layer. The light-transmissible layer is filled within the opening.

In an embodiment, the light-transmissible layer is a polymeric material layer, a photoresist layer, an indium tin oxide layer or an oxide layer.

In an embodiment, the alignment mark is made of a reflective material and arranged within a polysilicon layer, a metal gate layer or a diffusion layer of the photodiode layer or the metal wiring layer.

In an embodiment, the optical structure includes a color filter layer and a microlens layer.

In accordance with another aspect, the present invention provides a method of fabricating a backside-illuminated image sensor. Firstly, a first substrate having a first side and a second side is provided, wherein a sensing structure is formed on the first side of the first substrate, and the sensing structure includes an alignment mark. Then, a second substrate is provided and bonded to the first side of the first substrate. Then, a light-transmissible structure is formed on the second side of the first substrate at a location corresponding to the alignment mark. Afterwards, an optical structure is positioned on the second side of the first substrate by referring to the light-transmissible structure and the alignment mark.

In an embodiment, the step of bonding the second substrate to the first side of the first substrate is performed by forming an adhesive layer between the sensing structure and the second substrate, so that the second substrate is bonded with the first substrate through the adhesive layer.

In an embodiment, the sensing structure is produced by successively forming a photodiode layer and a metal wiring layer on the first side of the first substrate.

In an embodiment, the step of forming the light-transmissible structure includes the following sub-steps. Firstly, an opening is formed on the second side, wherein the area of the opening is greater than or equal to the area of the alignment mark. Then, a light-transmissible material layer is formed on the second side of the first substrate and in the opening. Then, the light-transmissible material layer is partially removed, thereby forming a light-transmissible layer within the opening.

In an embodiment, the depth of the opening is equal to the thickness of the first substrate.

In an embodiment, the depth of the opening is smaller than the thickness of the first substrate.

In an embodiment, a step of thinning the first substrate is performed before the opening is formed.

In an embodiment, the step of forming the light-transmissible structure includes the following sub-steps. Firstly, a positive photoresist layer is formed on the second side of the first substrate. Then, the positive photoresist layer is patterned with a photo mask. Then, the first substrate is etched by using patterned positive photoresist layer as an etch mask, thereby forming an opening in the second side of the first substrate, wherein the area of the opening is greater than or equal to the area of the alignment mark. Then, a light-transmissible material layer is formed on the second side of the first substrate and in the opening. Then, the light-transmissible material layer is patterned with the photo mask and partially removed, thereby forming a light-transmissible layer within the opening.

In an embodiment, the light-transmissible layer is a polymeric material layer, a photoresist layer, an indium tin oxide layer or an oxide layer.

In an embodiment, the optical structure is produced by forming a color filter layer over the second side of the first substrate and the opening.

In an embodiment, the optical structure is further produced by forming a microlens layer on the color filter layer.

In accordance with a further aspect, the present invention provides a light-transmissible structure. The light-transmissible structure is formed on a substrate including a first side and a second side. At least one alignment mark is disposed on the first side. The light-transmissible structure includes an opening and a light-transmissible layer. The opening is formed in the second side of the substrate and at a location corresponding to the alignment mark. The light-transmissible layer is filled within the opening.

In an embodiment, the depth of the opening is equal to the thickness of the substrate.

In accordance with a still aspect, the present invention provides a method of fabricating a light-transmissible structure. Firstly, a substrate having a first side and a second side is provided, at least one alignment mark is disposed on the first side. Then, an opening is formed in the second side of the substrate and at a location corresponding to the alignment mark. Then, a light-transmissible layer is filled within the opening.

BRIEF DESCRIPTION OF THE DRAWINGS

The above objects and advantages of the present invention will become more readily apparent to those ordinarily skilled in the art after reviewing the following detailed description and accompanying drawings, in which.

DETAILED DESCRIPTION OF PREFERRED EMBODIMENTS

The present invention will now be described more specifically with reference to the following embodiments. It is to be noted that the following descriptions of preferred embodiments of this invention are presented herein for purpose of illustration and description only. It is not intended to be exhaustive or to be limited to the precise form disclosed.

Figure 2:
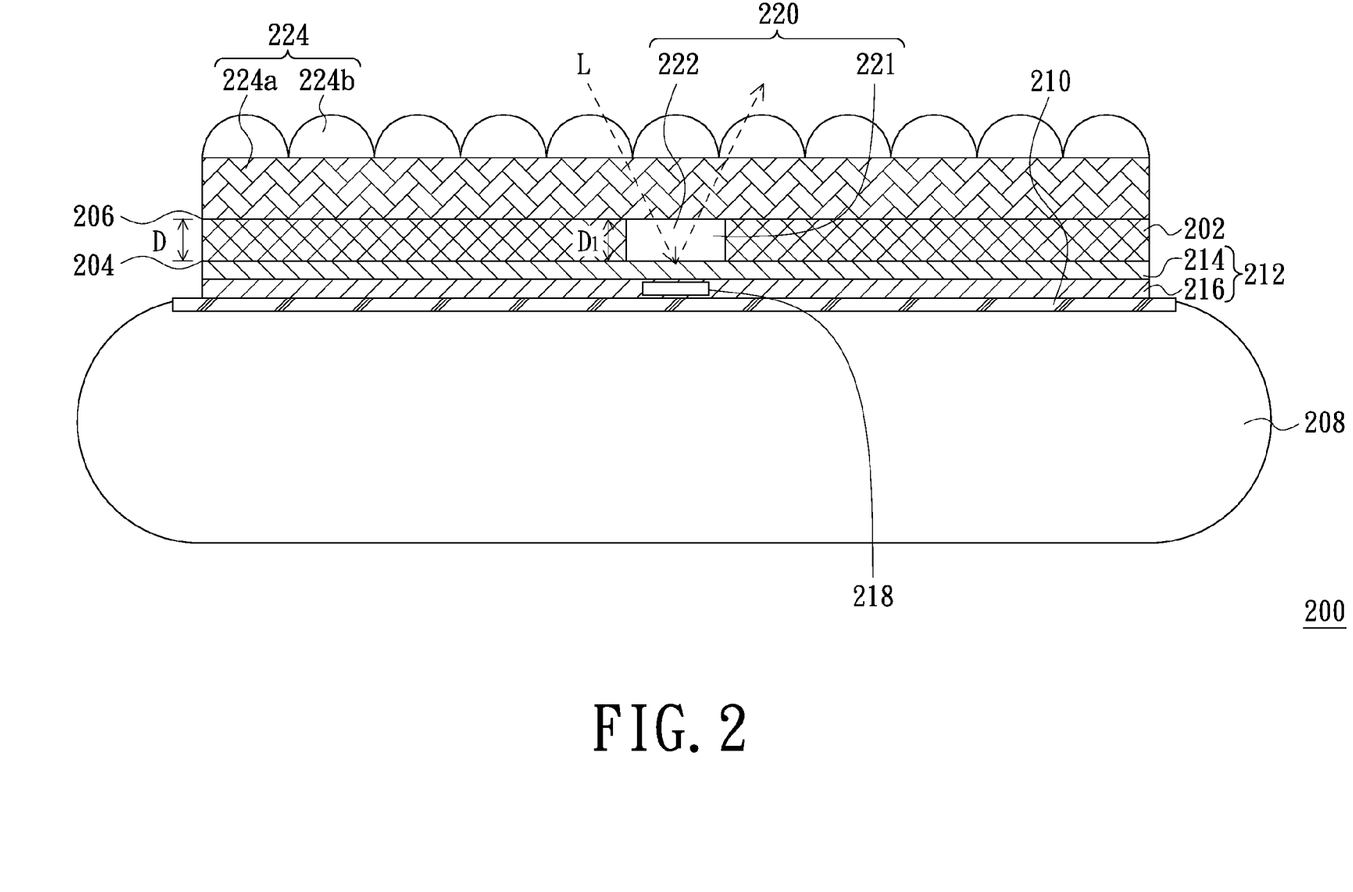
FIG. 2 is a schematic cross-sectional view illustrating a backside-illuminated image sensor according to an embodiment of the present invention.

FIG. 2 is a schematic cross-sectional view illustrating a backside-illuminated image sensor according to an embodiment of the present invention. As shown in FIG. 2, the backside-illuminated image sensor 200 comprises a first substrate 202, a second substrate 208, a sensing structure 212 and an optical structure 224. The first substrate 202 has a first side 204 and a second side 206. Moreover, a sensing structure 212 is formed on the first side 204 of the first substrate 202. The sensing structure 212 includes at least one alignment mark 218. Corresponding to the location of the alignment mark 218, a light-transmissible structure 220 is formed on the second side 206 of the first substrate 202. An adhesive layer 210 is arranged between the first substrate 202 and the second substrate 208. Via the adhesive layer 210, the second substrate 208 is bonded to the first substrate 202. By referring to the light-transmissible structure 220 and the alignment mark 218, the optical structure 224 is positioned on the second side 206 of the first substrate 202.

Moreover, the sensing structure 212 formed on the first side 204 of the first substrate 202 comprises a photodiode layer 214 and a metal wiring layer 216. The metal wiring layer 216 is arranged between the photodiode layer 214 and the second substrate 208. The sensing structure 212 includes at least one alignment mark 218. The alignment mark 218 may have any reflective pattern. The alignment mark 218 is made of any reflective material and arranged within the polysilicon layer, the metal gate layer or the diffusion layer of the photodiode layer 214 or the metal wiring layer 216.

Moreover, the light-transmissible structure 220 formed on the second side 206 of the first substrate 202 has an opening 222. Optionally, a light-transmissible layer may be filled within the opening 222. An example of the light-transmissible layer includes but is not limited to a polymeric material layer, a photoresist layer, an indium tin oxide layer or an oxide layer. The locations of the opening 222 and the light-transmissible structure 220 correspond to the location of the alignment mark 218. For increasing the light-receiving amount, the area of the opening 222 is greater than or equal to the area of the alignment mark 218. In this embodiment, the opening 222 further runs through the first side 204 of the first substrate 202. In this situation, the depth D1 of the opening 222 is equal to the thickness D of the first substrate 202, so that the alignment mark 218 is completely exposed.

Figure 3:
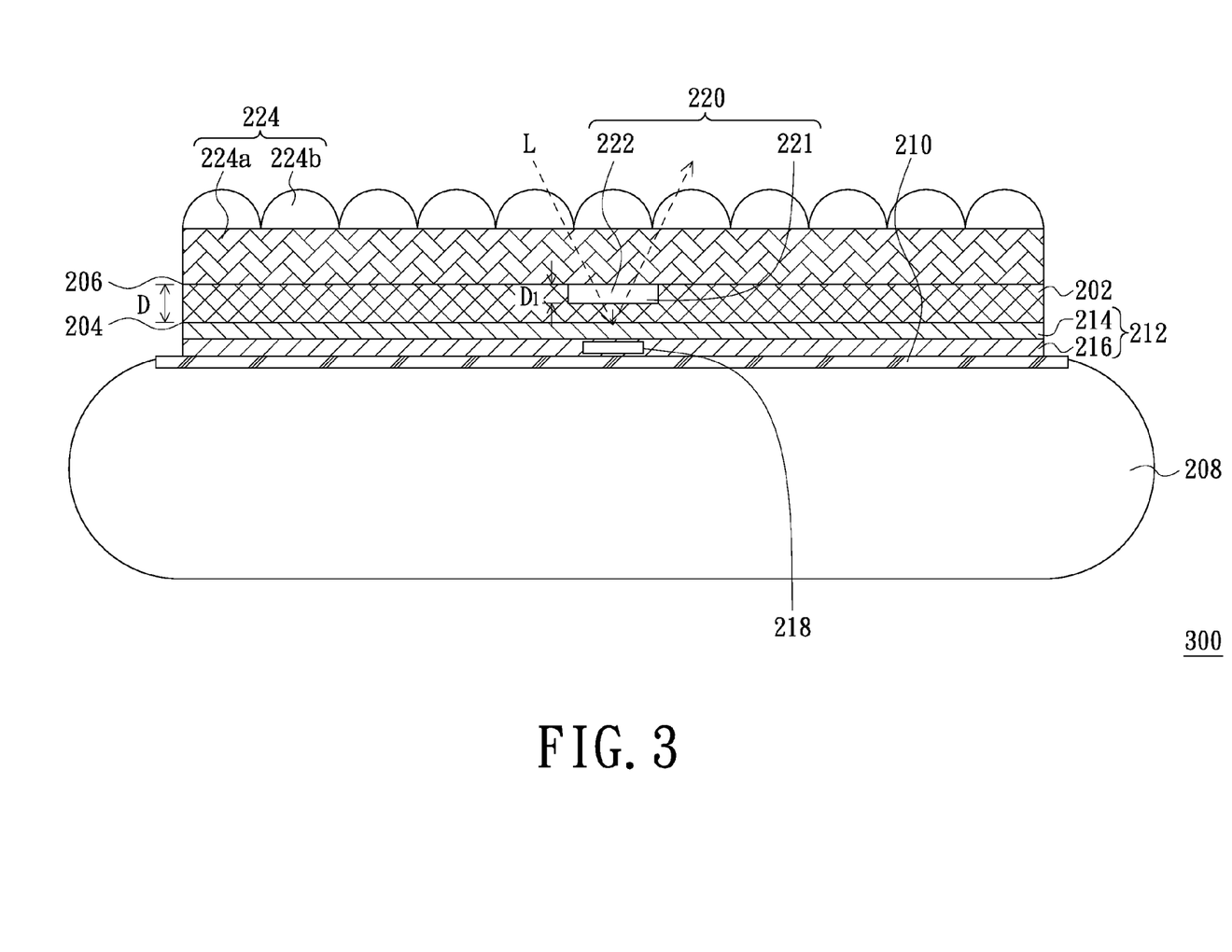
FIG. 3 is a schematic cross-sectional view illustrating a backside-illuminated image sensor according to another embodiment of the present invention.

FIG. 3 is a schematic cross-sectional view illustrating a backside-illuminated image sensor according to another embodiment of the present invention. In the backside-illuminated image sensor 300 of this embodiment, the opening 222 is formed in the second side 206 of the first substrate 202 without running through the first side 204. In this situation, the depth D1 of the opening 222 is smaller than the thickness D of the first substrate 202.

Please refer to FIG. 2 again. By referring to the light-transmissible structure 220 and the alignment mark 218, the optical structure 224 can be precisely positioned on the second side of the first substrate 202 so as to obviate the drawbacks encountered from the prior art. In the above embodiments, the optical structure 224 includes a color filter layer 224a and a microlens layer 224b.

Figure 4A:
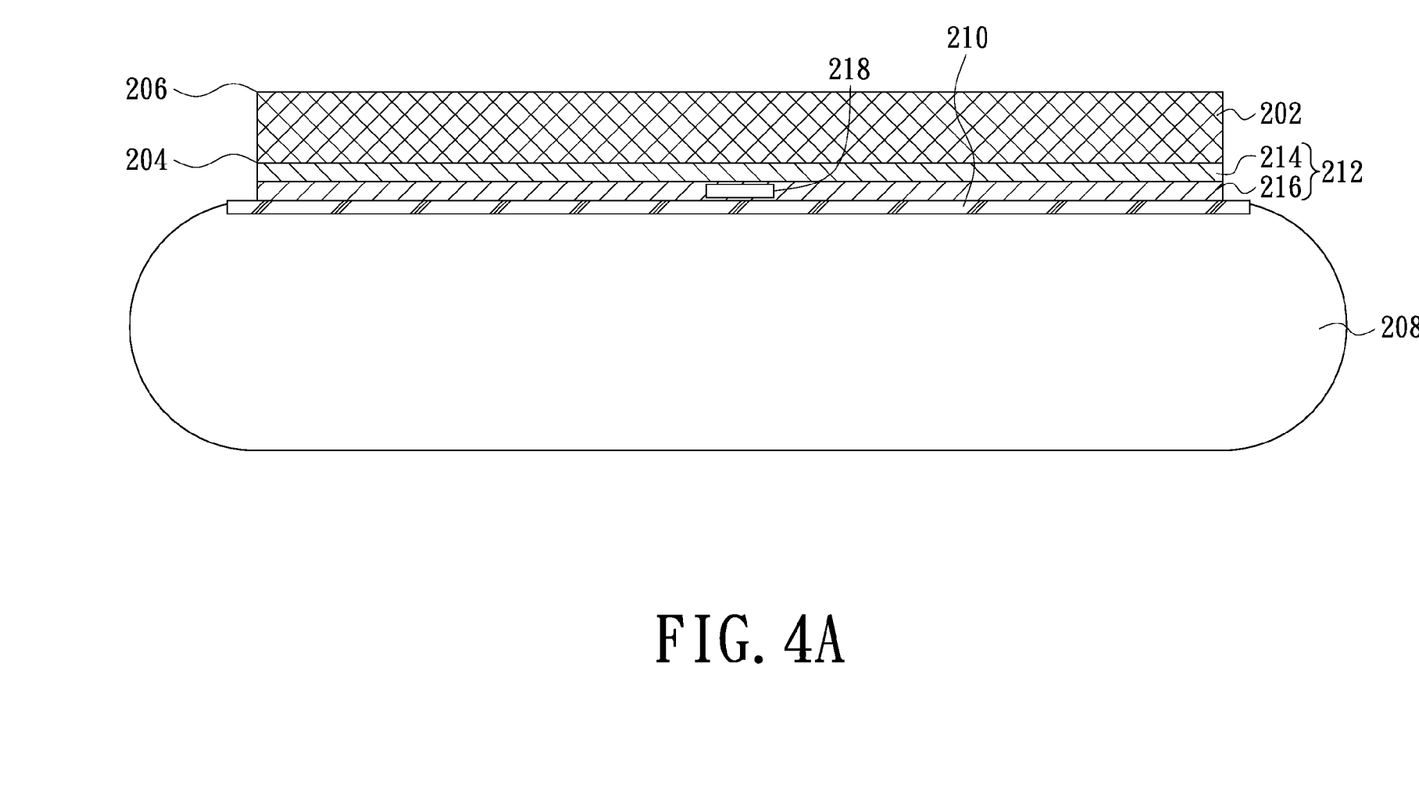
FIGS. 4A, 4B and 4C are schematic cross-sectional views illustrating partial steps of a method of fabricating a backside-illuminated image sensor according to an embodiment of the present invention.
Figure 4B:
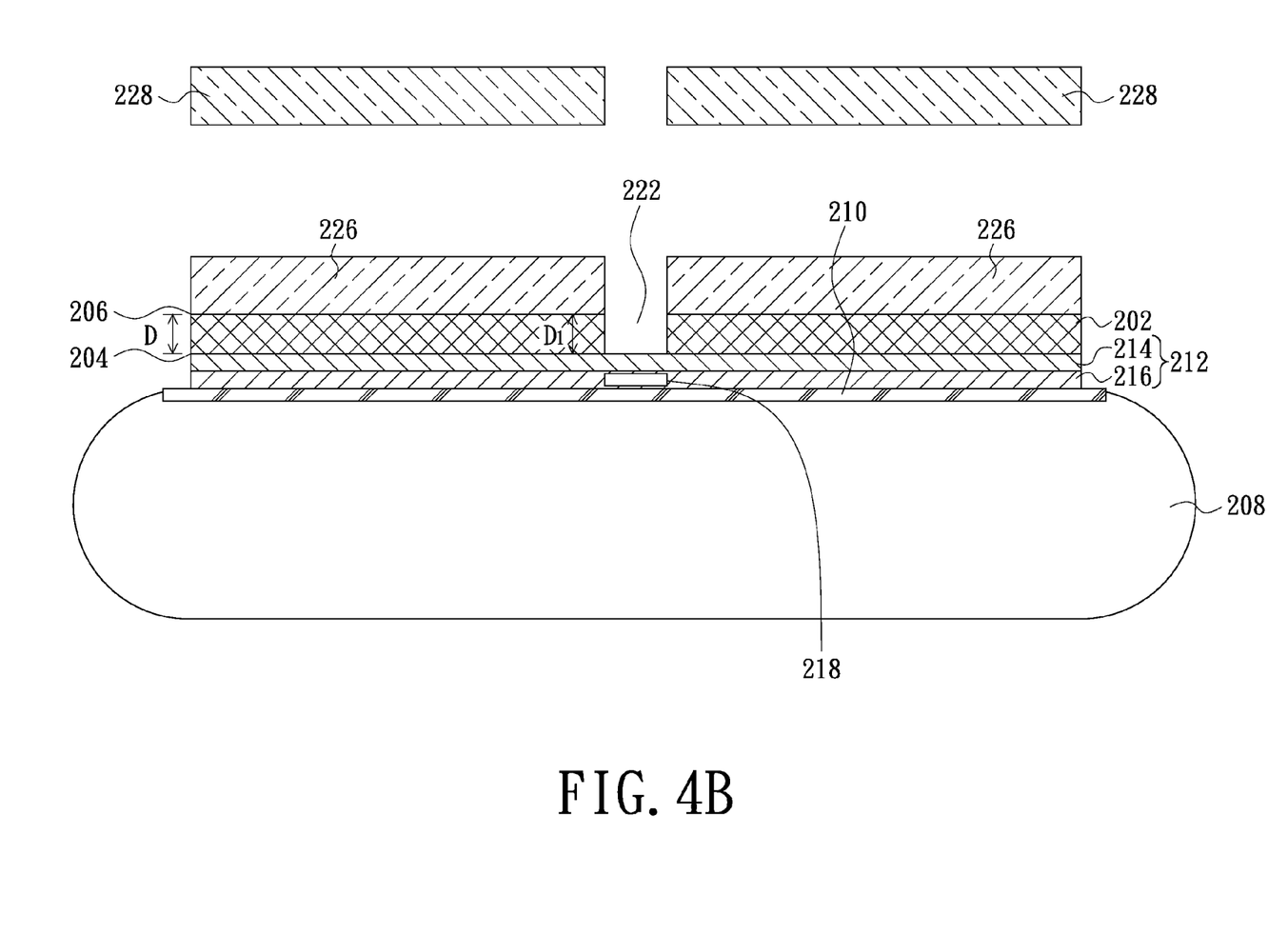
Figure 4C:
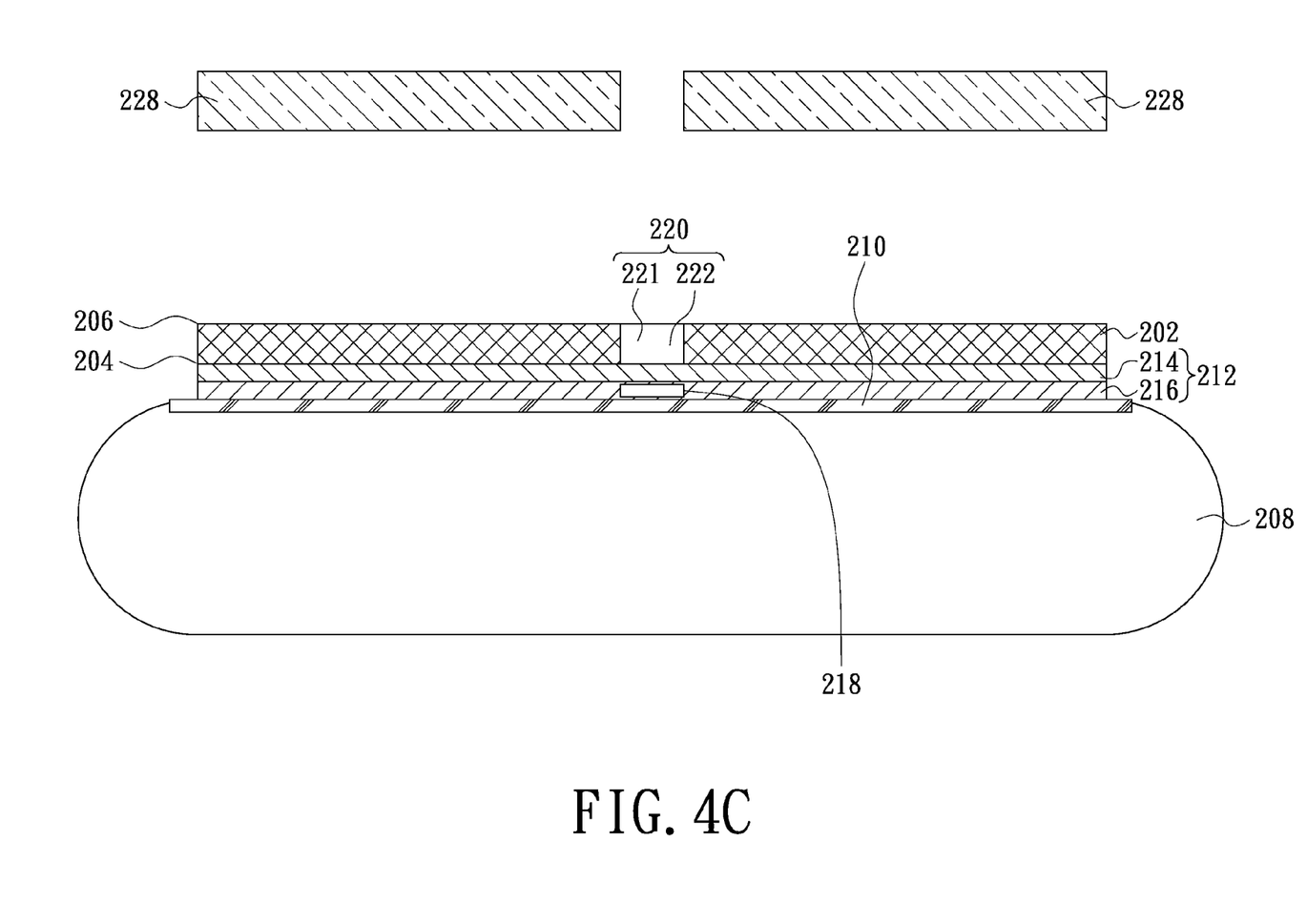

For fully understanding the present invention, a method of fabricating the backside-illuminated image sensor will be illustrated as follows. FIGS. 4A, 4B and 4C are schematic cross-sectional views illustrating some steps of a method of fabricating a backside-illuminated image sensor according to an embodiment of the present invention.

Firstly, as shown in FIG. 4A, a first substrate 202 is provided. The first substrate 202 has a first side 204 and a second side 206. A sensing structure 212 with a photodiode layer 214 and a metal wiring layer 216 is formed on the first side 204 of the first substrate 202. That is, the photodiode layer 214 and the metal wiring layer 216 are successively formed on the first side 204 of the first substrate 202. At least one alignment mark 218 with a specified pattern is formed within the sensing structure 212. Then, an adhesive layer 210 is formed between the first side 204 of the first substrate 202 and the second substrate 208. Via the adhesive layer 210, the second substrate 208 is bonded to the first substrate 202.

As shown in FIG. 4B, for increasing the light-receiving amount to facilitate subsequent alignment between the optical structure 224 and the sensing structure 212, the second side 206 of the first substrate 202 needs to be thinned. Then, a positive photoresist layer 226 is formed on the second side 206 of the substrate 202. The positive photoresist layer 226 is patterned by a photomask 228, and then the second side 206 of the first substrate 202 is partially etched to form an opening 222 by using the patterned positive photoresist layer 226 as an etch mask. The location of the opening 222 corresponds to the location of the alignment mark 218. The area of the opening 222 is greater than or equal to the area of the alignment mark 218 so as to reveal the whole alignment mark 218. In this embodiment, the depth D1 of the opening 222 is equal to the thickness D of the first substrate 202. Alternatively, by controlling the etching rate, the depth D1 of the opening 222 may be smaller than the thickness D of the first substrate 202 (see FIG. 3).

Then, as shown in FIG. 4C, the positive photoresist layer 226 is removed. A light-transmissible material layer (not shown) is formed within the opening 222 and on the second side 206 of the first substrate 202. For example, the light-transmissible material layer is a negative photoresist layer or a polymeric material layer. In this embodiment, a negative photoresist layer is used as the light-transmissible material layer. The negative photoresist layer is patterned by the above-mentioned photo mask 228 that is used for forming the opening 222 of the second side 206, and then the exposed negative photoresist layer is removed. Since the patterned negative photoresist layer is readily cross-linked after exposure, the patterned negative photoresist layer will be retained within the opening 222 and difficult to be etched off. After the residual negative photoresist layer over the opening 222 is smoothed, a light-transmissible structure 220 is formed within the opening 222. In some embodiments, the light-transmissible material layer is a polymeric material layer. After the light-transmissible material layer is formed over the second side 206 of the first substrate 202 and within the opening 222, the second side 206 is smoothed, and thus a light-transmissible layer 221 is formed within the opening 222.

Then, an alignment process is performed by means of a positioning light. By referring to the opening 222, the light-transmissible structure 220 and the alignment mark 218, an optical structure 224 is formed on the second side 206 of the first substrate 202. The resulting structure of the backside-illuminated image sensor 200 is shown in FIG. 2. The optical structure 224 is produced by forming a color filter layer 224*a* over the second side 206 of the first substrate 202 and the opening 222 and then forming a microlens layer 224*b* on the optical structure 224.

From the above description, in the backside-illuminated image sensor of the present invention, a sensing structure with at least one alignment mark is formed on a first side of the first substrate, and a light-transmissible structure is formed on a second side of the first substrate corresponding to the location of the alignment mark. After the positioning light is projected on the alignment mark through the opening and the light-transmissible structure, the positioning light is reflected by the alignment mark and directed to the surrounding through the light-transmissible structure and the opening. In such way, the strength of the reflected positioning light is still acceptable. That is, the intensity of the positioning light is not largely reduced when compared with the prior art technology. Moreover, according to the present invention, the optical structure can be positioned on the second side of the first substrate more precisely.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A method of fabricating a backside-illuminated image sensor, the method comprising steps of:
   providing a first substrate having a first side and a second side, wherein a sensing structure is formed on the first side of the first substrate, and the sensing structure includes an alignment mark;
   providing a second substrate and bonding the second substrate to the first side of the first substrate;
   forming a light-transmissible structure on the second side of the first substrate at a location corresponding to the alignment mark; and
   positioning an optical structure on the second side of the first substrate by referring to the light-transmissible structure and the alignment mark.

2. The backside-illuminated image sensor according to claim 1, wherein the step of bonding the second substrate to the first side of the first substrate is performed by forming an adhesive layer between the sensing structure and the second substrate, so that the second substrate is bonded with the first substrate through the adhesive layer.

3. The method according to claim 1, wherein the sensing structure is produced by successively forming a photodiode layer and a metal wiring layer on the first side of the first substrate.

4. The method according to claim 1, wherein the step of forming the light-transmissible structure comprises sub-steps of:
   forming an opening in the second side, wherein the area of the opening is greater than or equal to the area of the alignment mark;
   forming a light-transmissible material layer on the second side of the first substrate and in the opening; and
   partially removing the light-transmissible material layer, thereby forming a light-transmissible layer within the opening.

5. The method according to claim 1, wherein the step of forming the light-transmissible structure comprises sub-steps of:
   forming a positive photoresist layer on the second side of the first substrate;
   patterning the positive photoresist layer with a photo mask;
   etching the first substrate by using patterned positive photoresist layer as an etch mask, thereby forming an opening in the second side of the first substrate, wherein the area of the opening is greater than or equal to the area of the alignment mark;
   forming a light-transmissible material layer on the second side of the first substrate and in the opening; and
   patterning the light-transmissible material layer with the photo mask, and partially removing the light-transmissible material layer, thereby forming a light-transmissible layer within the opening.

6. The method according to claim 1, wherein the optical structure is produced by forming a color filter layer over the second side of the first substrate and the opening.

7. The method according to claim 4, wherein the depth of the opening is equal to the thickness of the first substrate.

8. The method according to claim 4, wherein the depth of the opening is smaller than the thickness of the first substrate.

9. The method according to claim 4, further comprising a step of thinning the first substrate before the opening is formed.

10. The method according to claim 5, wherein the light-transmissible layer is a polymeric material layer, a photoresist layer, an indium tin oxide layer or an oxide layer.

11. The method according to claim 6, wherein the optical structure is further produced by forming a microlens layer on the color filter layer.

12. A method of fabricating a light-transmissible structure, the method comprising steps of:
providing a substrate having a first side and a second side, wherein at least one alignment mark is disposed on the first side;
forming an opening in the second side of the substrate and at a location corresponding to the alignment mark; and
filling a light-transmissible layer within the opening.

* * * * *